United States Patent
Harada

(10) Patent No.: US 11,913,470 B2
(45) Date of Patent: Feb. 27, 2024

(54) DUCTED FAN, MULTICOPTER, VERTICAL TAKE-OFF AND LANDING AIRCRAFT, CPU-COOLING FAN, AND RADIATOR-COOLING FAN

(71) Applicant: JAPAN AEROSPACE EXPLORATION AGENCY, Tokyo (JP)

(72) Inventor: Masashi Harada, Tokyo (JP)

(73) Assignee: JAPAN AEROSPACE EXPLORATION AGENCY, Tokyo (JP)

( * ) Notice: Subject to any disclaimer, the term of this patent is extended or adjusted under 35 U.S.C. 154(b) by 296 days.

(21) Appl. No.: 16/754,064

(22) PCT Filed: Aug. 29, 2018

(86) PCT No.: PCT/JP2018/032006
§ 371 (c)(1),
(2) Date: Apr. 6, 2020

(87) PCT Pub. No.: WO2019/069591
PCT Pub. Date: Apr. 11, 2019

(65) Prior Publication Data
US 2020/0325910 A1    Oct. 15, 2020

(30) Foreign Application Priority Data
Oct. 5, 2017   (JP) ................................. 2017-194779

(51) Int. Cl.
*F04D 29/40*   (2006.01)
*F04D 19/00*   (2006.01)
(Continued)

(52) U.S. Cl.
CPC ............ *F04D 29/403* (2013.01); *B64C 11/18* (2013.01); *B64C 29/00* (2013.01); *F04D 19/002* (2013.01); *F04D 29/384* (2013.01)

(58) Field of Classification Search
CPC ..... B64C 11/18; F04D 29/384; F04D 29/403; F04D 19/002; F04D 29/388; B21C 23/16
See application file for complete search history.

(56) References Cited

U.S. PATENT DOCUMENTS 2,536,130 A * 1/1951 Herrman ............... F04D 29/545
                                                           415/222
3,184,183 A   5/1965 Piasecki
(Continued)

FOREIGN PATENT DOCUMENTS

CN   102935892 A       2/2013
EP       3018359 A1 *  5/2016  ........... F04D 29/326
(Continued)

OTHER PUBLICATIONS

Raza, I. et al. Experimental Study on Tip Clearance Effects for Performance Characteristics of Ducted Fan. 2009 KSPE Fall Conference. pp.395-398. Available from https://koreascience.or.kr/article/CFKO200911764903248.pdf (Year: 2009).*

(Continued)

*Primary Examiner* — Topaz L. Elliott
(74) *Attorney, Agent, or Firm* — Saliwanchik, Lloyd & Eisenschenk

(57) ABSTRACT

[Object] To maximize static thrust of a ducted fan. [Solving Means] This ducted fan 1 includes a duct 10, a fan 20, a motor 30, a housing 40, and stators 50. The fan 20 includes a hub 21 disposed concentric with the duct 10 and four blades 22 arranged at equal intervals on the outer circumference of the hub 21. A chord length CL of the blade 22 gradually decreases toward a tip 22A from the root. In (Continued)

contrast, the chord length CL of the blade 22 increases to the tip 21B from a tip vicinity portion 22B.

8 Claims, 10 Drawing Sheets

(51) Int. Cl.
  *F04D 29/38* (2006.01)
  *B64C 11/18* (2006.01)
  *B64C 29/00* (2006.01)

(56) References Cited

U.S. PATENT DOCUMENTS

| | | | | |
|---|---|---|---|---|
| 5,320,493 | A * | 6/1994 | Shih | F04D 29/386 |
| | | | | 416/223 R |
| 5,342,173 | A * | 8/1994 | Vera | F04D 29/326 |
| | | | | 416/169 A |
| 5,399,070 | A * | 3/1995 | Alizaden | F04D 29/326 |
| | | | | 416/241 A |
| 5,906,179 | A * | 5/1999 | Capdevila | F04D 29/326 |
| | | | | 416/223 R |
| 6,190,132 | B1 * | 2/2001 | Yamakawa | B64C 27/46 |
| | | | | 416/DIG. 2 |
| 6,375,419 | B1 * | 4/2002 | LeJambre | F01D 5/141 |
| | | | | 415/208.2 |
| 7,014,423 | B2 * | 3/2006 | Parker | F24F 1/50 |
| | | | | 415/220 |
| 10,473,107 | B1 * | 11/2019 | Newton | B64U 30/20 |
| 11,365,634 | B2 * | 6/2022 | Goodhand | B64C 11/001 |
| 2002/0104919 | A1 | 8/2002 | Geranio et al. | |
| 2003/0182954 | A1 * | 10/2003 | Parker | F24F 1/50 |
| | | | | 62/186 |
| 2004/0165986 | A1 * | 8/2004 | Parker | F04D 29/328 |
| | | | | 415/220 |
| 2004/0253103 | A1 * | 12/2004 | Iwase | F04D 29/384 |
| | | | | 415/220 |
| 2005/0207894 | A1 * | 9/2005 | Park | F04D 29/326 |
| | | | | 416/223 R |
| 2009/0016870 | A1 * | 1/2009 | Kodama | F04D 29/324 |
| | | | | 415/72 |
| 2009/0220334 | A1 | 9/2009 | Vouche | |
| 2011/0049307 | A1 | 3/2011 | Yoeli | |
| 2011/0182740 | A1 | 7/2011 | Klinetob et al. | |
| 2012/0003098 | A1 * | 1/2012 | Lewis | F04D 29/388 |
| | | | | 416/223 R |
| 2012/0195767 | A1 * | 8/2012 | Gervais | B64C 27/82 |
| | | | | 416/243 |
| 2013/0233964 | A1 | 9/2013 | Woodworth et al. | |
| 2014/0234112 | A1 | 8/2014 | Read | |
| 2015/0000252 | A1 * | 1/2015 | Moore | F02K 3/072 |
| | | | | 137/15.1 |
| 2020/0157944 | A1 * | 5/2020 | Goodhand | F04D 29/325 |
| 2021/0147091 | A1 * | 5/2021 | Deloyer | B64U 30/20 |

FOREIGN PATENT DOCUMENTS

| | | | | |
|---|---|---|---|---|
| FR | 2598184 | A1 * | 11/1987 | |
| JP | H06293296 | A * | 10/1994 | B64C 29/00 |
| JP | 2000-264295 | A | 9/2000 | |
| JP | 2009-539033 | A | 11/2009 | |
| JP | 2011-513688 | A | 4/2011 | |
| KR | 20070081352 | A * | 8/2007 | F04D 29/326 |
| WO | WO-2012/080737 | A3 | 6/2012 | |

OTHER PUBLICATIONS

Mistry, C. and Pradeep A M. Design and performance analysis of a low speed, high aspect ratio contra rotating fan stage. The 11th Asian International Conference on Fluid Machinery and The 3rd Fluid Power Technology Exhibition. Nov. 21-23, 2011. DOI: 10.13140/2.1.1356.2884 (Year: 2011).*

Office Action dated Jan. 31, 2022 in Japanese Application No. 2017-194779.

Office Action dated Aug. 5, 2021 in Japanese Application No. 2017-194779.

Yamana, M. et al., "Aircraft Designing Theory," 1980, pp. 388-393, Yokendo Co., Ltd.

Betz, A. et al., "Schraubenpropeller mit geringstem Energieverlust (Screw Propellers with Minimum Induced Loss)," *Goettingen Reports*, 1919, pp. 193-213.

Harada, M., "Design of Maximum Thrust Ducted Fan," *Japan Society for Aeronautical and space Sciences papers*, 2018, 66(3):75-83.

Harada, M. et al., "Optimum Design of Ducted Propellers," *Journal of the Japan Society for Aeronautical and Space Sciences*, 2011, 59(694):298-305.

International Search Report in International Application No. PCT/JP2018/032006, filed Aug. 29, 2018.

Office Action dated May 9, 2022 in Japanese Application No. 2017-194779.

\* cited by examiner

DUCTED FAN, MULTICOPTER, VERTICAL TAKE-OFF AND LANDING AIRCRAFT, CPU-COOLING FAN, AND RADIATOR-COOLING FAN

CROSS-REFERENCE TO RELATED APPLICATIONS

This application is the U.S. national stage application of International Patent Application No. PCT/JP2018/032006, filed Aug. 29, 2018, which claims the benefit under 35 U.S.C. § 119 of Japanese Application No. 2017-194779, filed Oct. 5, 2017, the disclosures of each of which are incorporated herein by reference in their entirety.

TECHNICAL FIELD

The present invention relates to a ducted fan used for obtaining propulsion force and cooling air, a multicopter and a vertical take-off and landing aircraft each including such a ducted fan, and a CPU-cooling fan and a radiator-cooling fan each including such a ducted fan.

BACKGROUND ART

Multicopter-type drones have been widely used not only for observation and photographing but also for goods transport. Since multicopter have been increased in size for transporting bigger and heavier goods, there is a fear that their blades that rotate with higher power may cause injury accidents. One of examples for enhancing the safety to humans is providing propellers with exterior guards. Furthermore, ETOP (Patent Literature 1) in the state of Israel uses a ducted fan. Regarding manned aircraft, VZ-8 (Patent Literature 2) manufactured by Piasecki Helicopter Corporation in the United States and Cormorant (Patent Literature 3) in the state of Israel each use two ducted fans.

The use of the ducted fan provides not only an advantage that the safety to humans can be improved but also advantages that noise can be reduced by adding a sound absorbing material to a duct inner surface, that the ducted fan can provide thrust theoretically 1.27 times as high as (Non-Patent Literature 1), experimentally 1.4 times as high as a conventional propeller when those have the same power and the same diameter because a duct lip also generates thrust, etc.

CITATION LIST

Patent Literature

Patent Literature 1: US2013/0233964A1
Patent Literature 2: U.S. Pat. No. 3,184,183A
Patent Literature 3: US2011/049307A1

Non-Patent Literature

Non-Patent Literature 1: "Aircraft Designing Theory" Masao YAMANA and Hiroshi NAKAGUCHI, published by YOKENDO CO., LTD. 1980, pp. 388-393.
Non-Patent Literature 2: Betz, A., Prandtl, L.: Schraubenpropeller mit geringstem Energieverlust (Screw Propellers with Minimum Induced Loss), Goettingen Reports 1919, pp. 193-213.
Non-Patent Literature 3: Masashi HARADA: optimum design of ducted propellers, JOURNAL OF THE JAPAN SOCIETY FOR AERONAUTICAL AND SPACE SCIENCES, Vol. 59, No. 694, pp. 298-305, 2011.

DISCLOSURE OF INVENTION

Technical Problem

Non-Patent Literature 2 has disclosed a method of determining an optimum shape of a propeller blade having low disc loading. The inventor of the present invention has reported a problem to maximize ducted propeller thrust (Non-Patent Literature 3). However, this report can be applied only to a case where the disc loading is low, for example, cruising flight, and it cannot be applied to a ducted fan that maximizes static thrust.

It is an object of the present invention to provide a ducted fan capable of maximizing static thrust.

It is an object of the present invention to provide a multicopter and a vertical take-off and landing aircraft each including such a ducted fan.

It is an object of the present invention to provide a CPU-cooling fan and a radiator-cooling fan each including such a ducted fan.

Solution to Problem

In order to accomplish the above-mentioned object, a ducted fan according to an embodiment of the present invention includes: a duct including a round-shaped lip at an intake port; and a fan including a blade whose tip is adjacent to an inner wall of the duct and whose chord length gradually decreases toward the tip and increases or is constant to the tip from a tip vicinity portion.

According to the knowledge of the inventor of the present invention, since the tip of the blade and the inner wall of the duct are adjacent to each other, substantially no vortices go through a gap therebetween and energy loss due to vortices lowers. Moreover, since the chord length of the blade is made to gradually decrease toward the tip, the flow inside the duct can be made more uniform while ensuring the strength. Furthermore, since the chord length of the blade increases to the tip from the tip vicinity portion, the flow rate of the outer board of the inside of the duct increases, and thrust based on upward suction produced in accordance with the flow rate of the flow going around the round-shaped lip of the duct increases. The gain of lowering of the energy loss owing to the more uniform flow inside the duct because of the suitable gradual decrease of the chord length of the blade toward the tip and the gain of the thrust increase owing to increase in velocity of the outer board of the inside of the duct because of the increase at the tip take optimum values without interfering with each other. As a result, static thrust can be maximized.

Advantageous Effects of Invention

In accordance with the present invention, static thrust of a ducted fan can be maximized.

MODE(S) FOR CARRYING OUT THE INVENTION

Hereinafter, an embodiment of the present invention will be described with reference to the drawings.

Figure 1:
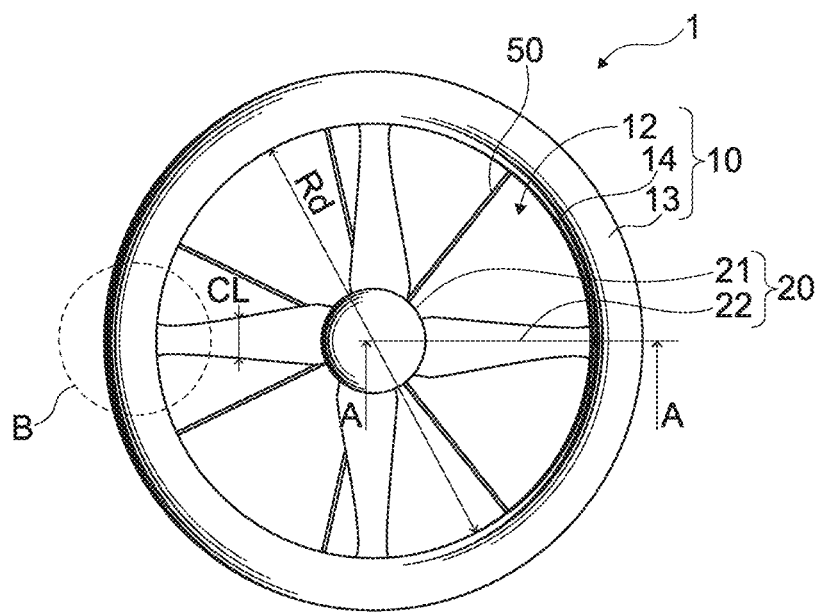
FIG. 1 A top view showing a ducted fan according to an embodiment of the present invention.
Figure 2:
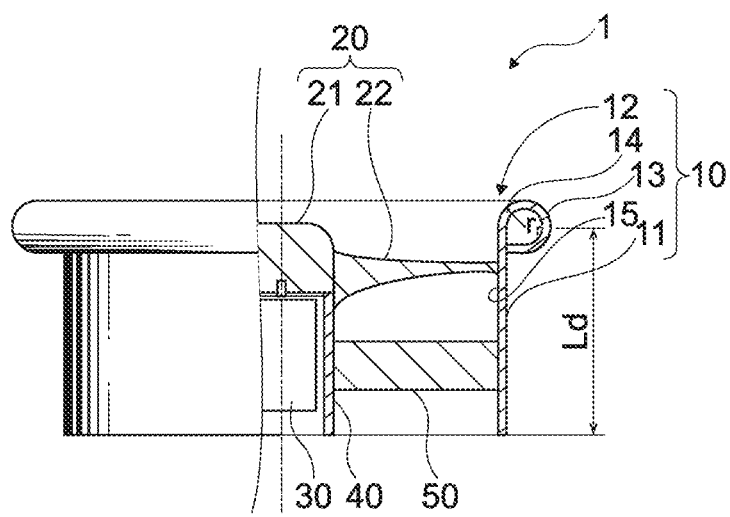
FIG. 2 A cross-sectional view taken along the line A-A of FIG. 1.

FIG. 1 is a top view showing a ducted fan according to an embodiment of the present invention and FIG. 2 is a cross-sectional view taken along the line A-A of FIG. 1.

A ducted fan 1 includes a duct 10, a fan 20, a motor 30, a housing 40, and stators 50.

The duct 10 includes a cylindrical duct main body 11 and a flange 13. The flange 13 is provided at an intake port 12 of the duct main body 11. The intake port 12 of the duct main body 11 includes a round-shaped lip 14.

The fan 20 includes a hub 21 and four blades 22. The hub 21 is disposed concentric with the duct 10. The four blades 22 are arranged at equal intervals on the outer circumference of the hub 21. It should be noted that the number of blades 22 is typically four and two to eight blades 22 are favorably used. Moreover, setting the number of blades 22 such that the least common multiple of the number of blades 22 and the number of stators 50 takes a larger value, for example, using four blades 22 for seven stators 50 can inhibit the positions of the plurality of blades 22 and the plurality of stators 50 from overlapping at the same time and reduce noise due to the interference.

The hub 21 is rotationally driven by the motor 30 housed in the housing 40. Accordingly, the blades 22 rotate.

The plurality of stators 50 is fixedly arranged to link the outer circumference of the housing 40 to an inner wall 15 of the duct 10. Accordingly, the housing 40 is fixedly disposed at the center of the duct 10.

Figure 3:
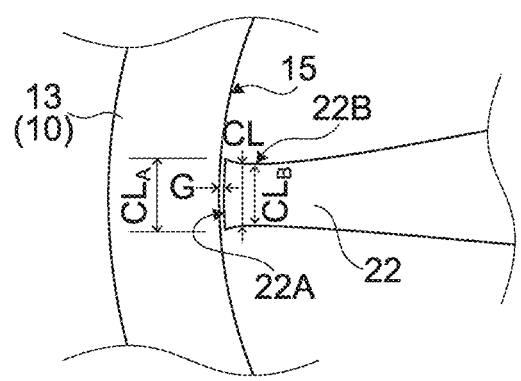
FIG. 3 An enlarged diagram of a region indicated by the sign B of FIG. 1.
}

FIG. 3 is an enlarged diagram of a region indicated by the sign B of FIG. 1.

Each blade 22 has a tip 22A adjacent to the inner wall 15 of the duct 10. A gap G between the tip 22A and the inner wall 15 of the duct 10 is favorably as small as possible unless the tip 22A touches the inner wall 15 of the duct 10.

Figure 4:
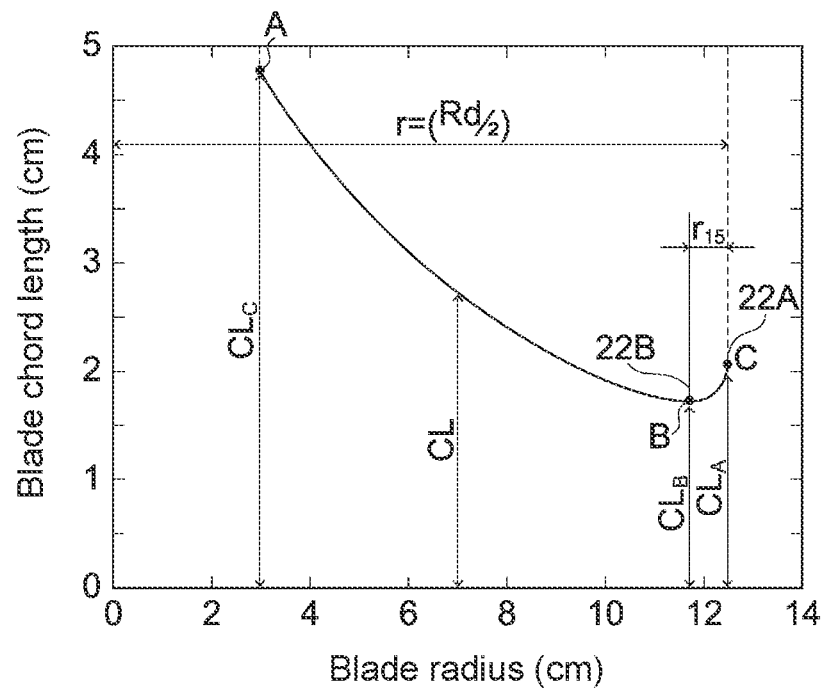
FIG. 4 A graph showing a distribution example of a blade chord length in the ducted fan according to the embodiment of the present invention.

FIG. 4 is a graph showing a distribution example of a chord length CL of the blade 22.

The chord length CL of the blade 22 gradually decreases toward the tip 22A from the root. That is, the chord length CL of the blade 22 is largest at the root and gradually becomes smaller toward the tip. In contrast, the chord length CL of the blade 22 increases to the tip 22A from a tip vicinity portion 22B. It should be noted that this chord length CL may be constant to the tip 22A from the tip vicinity portion 22B.

Since the chord length CL of the blade 22 gradually decreases toward the tip 22A from the root, the flow inside the duct can be made more uniform. In addition, the strength of the blade 22 is easily ensured and an aerodynamically excellent, thin airfoil can be used from the root to the tip.

Here, assuming that the chord length of the tip 22A of the blade 22 is denoted by $CL_A$ and the chord length of the tip vicinity portion 22B of the blade 22 is denoted by $CL_B$, the following expression is favorably established.

$$1.0 \times CL_B \leq CL_A \leq 1.3 \times CL_B$$

In a case where $CL_A$ exceeds $1.3 \times CL_B$, the airflow inside the duct 10 is not uniform.

The position of the tip vicinity portion 22B at which the chord length CL of the blade 22 increases as described above is favorably within a distance equivalent to 15% ($r_{15}$ in FIG. 4) of the radius (r of FIG. 4) of the blade 22 from the tip 22A. In a case where the position of the tip vicinity portion 22B departs from the distance equivalent to 15% of the radius of the blade 22, that is, in a case where the region in which the chord length CL gradually decreases toward the tip 22A is made too small, the gradual decrease of the chord length CL of the blade 22 cannot make the flow inside the duct 10 sufficiently uniform.

A rate of such gradual decrease of the chord length CL of the blade 22 is favorably lower toward the tip 22A. This chord length distribution in which the rate of gradual decrease lowers makes the flow inside the duct more uniform, and the inductive energy loss is minimized.

A ratio of a maximum chord length of the blade 22 (chord length $CL_C$ of the root of the blade 22) to a minimum chord length (chord length $CL_B$ of the tip vicinity portion 22B) is favorably 1.5 or more and 3.0 or less. This taper ratio is lower and closer to 1.5 in a case where design to limit the blade tip velocity and produce higher thrust is made. This taper ratio is closer to 3.0 in a case of producing lower thrust. Therefore, an optimum taper ratio ranges from 1.5 to 3.

A diameter Dh of the hub 21 is favorably a diameter equivalent to 10% or more and 50% or less of an inner diameter Rd of the duct 10. In a case where the diameter Dh of the hub 21 is smaller than the diameter equivalent to 10%, the chord length at the blade root is designed to be smaller, and it is difficult to keep the strength. In a case where the diameter Dh of the hub 21 is larger than the diameter equivalent to 50%, the area of the hub that occupies the area of the blade rotation surface becomes too large, and thrust that can be produced decreases.

Assuming that the inner diameter of the duct 10 is denoted by Rd, the lip 14 at the intake port 12 of the duct main body 11 favorably has a round shape having a radius of curvature $r_r$ as follows.

$$3/100 \times Rd \leq r_r \leq 30/100 \times Rd$$

In a case where the radius of curvature $r_r$ is smaller than 3/100, separation of the flow going around the lip occurs. In a case where the radius of curvature $r_r$ is larger than 30/100, the lip is unnecessarily bigger, which contributes to unnecessary increase in size of the ducted fan.

A length Ld (see FIG. 2) of the duct 10 is favorably larger than a length equivalent to 25% of the inner diameter of the duct 10 Rd. In a case where the length Ld of the duct 10 is smaller than the length equivalent to 25%, flow contraction occurs at the back of the duct and the figure of merit lowers.

Examples

An example of the ducted fan 1 configured as described above will be shown.

Table 1 shows design conditions and Table 2 shows performance of the designed ducted fan 1.

TABLE 1

| | |
|---|---|
| Duct diameter (cm) | 25 |
| Duct length (cm) | 12 |
| Front duct length (cm) | 2.0 |
| Radius of curvature of lip/duct diameter | 0.06 |
| Hub diameter (cm) | 6.0 |
| Flange diameter (cm) | 50 |
| Number of blades | 4 |
| Blade rotational velocity (rpm) | 12000 |
| Required power (W) | 1200 |
| Design lift coefficient | 0.6 |
| Design drag coefficient | 0.014 |
| Airfoil | Eppler E205 |

TABLE 2

| | |
|---|---|
| Thrust(N) | 63.2 |
| Figure of merit(%) | 91.8 |

As shown in Table 2, the thrust was 63.2 N and the figure of merit was 0.854.

The distribution of the chord length of the ducted fan 1 according to this example is as shown in FIG. 4. The chord length is largest, 4.77 cm at a point A of the root of the blade 22. The chord length decreases to a point B from the point A. The rate of decrease is highest at the point A, lowers toward the tip, and is lowest at the point B. The radial position of the point B is 11.7 cm that is equivalent to 85.2% of the blade radius. Moreover, the chord length at the point B is 1.71 cm that is equivalent to 35.9% of the value at the point A. The chord length increases toward the tip 22A from the point B and reaches a point C of the tip. The chord length at the point C of the tip is 2.06 cm that is 1.2 times as large as the value at the point B.

Figure 5:
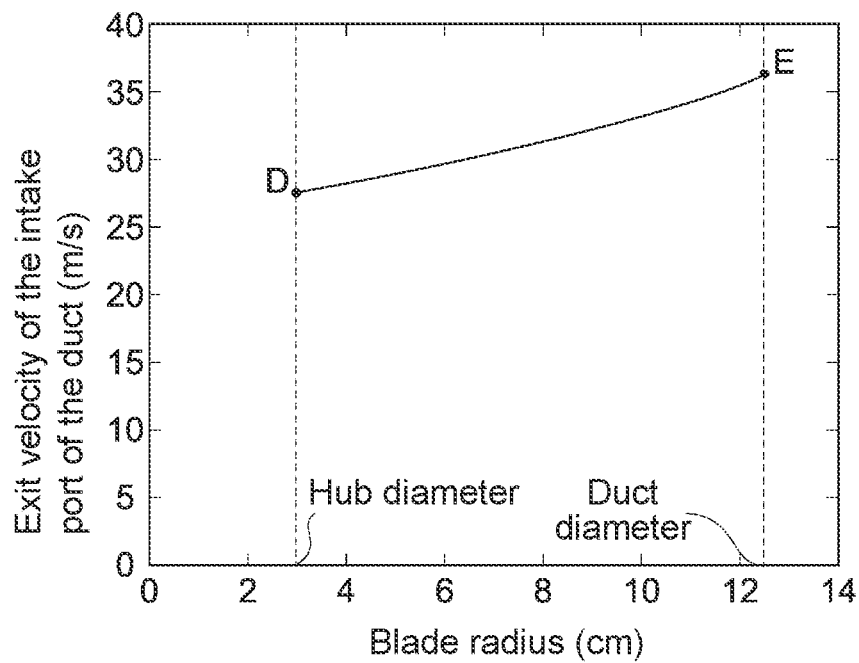
FIG. 5 A graph showing exit velocity of an airflow at an intake port of a duct in an example according to the present invention.

FIG. 5 shows an exit velocity v of the airflow at the intake port 12 of the duct 10 in this example.

As shown in FIG. 5, the exit velocity v monotonically increases to a point E of the tip 22A from a point D of the root of the blade 22 and can be approximated by a linear function.

Assuming that the radius of the blade 22 is denoted by r, it is approximated by the following linear function.

$$v = ar + b$$

Figure 6:
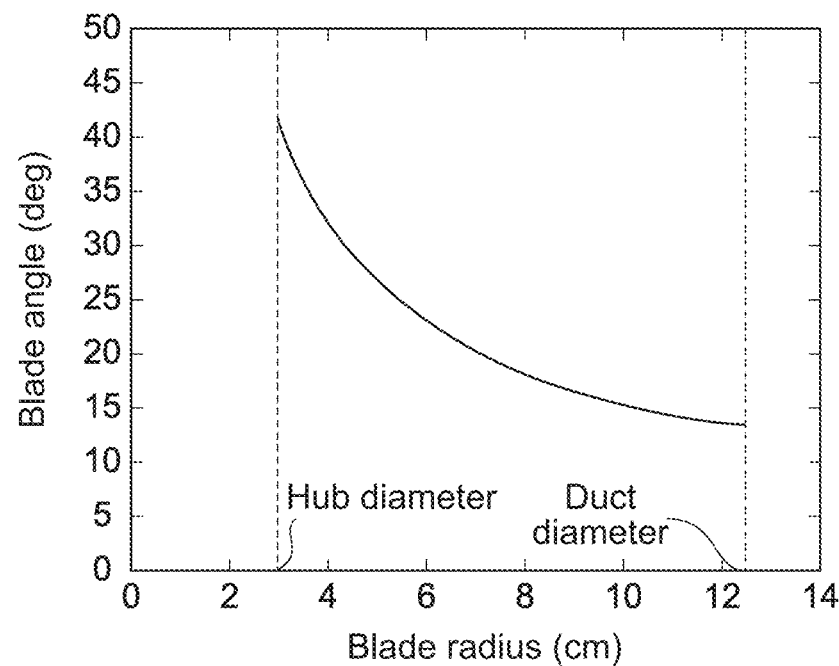
FIG. 6 A graph showing a blade angle of a blade in the example according to the present invention.

That is, the blade angle θ is expressed as follows.

$$\theta = \tan^{-1}((ar+b)/r\Omega) + \theta_0$$

Where Ω denotes blade rotation angular velocity and $\theta_0$ denotes an angle of attack of the wing (blade 22) that provides a lift coefficient of 0.6 for example. FIG. 6 shows a blade angle of such a blade 22.

Figure 7:
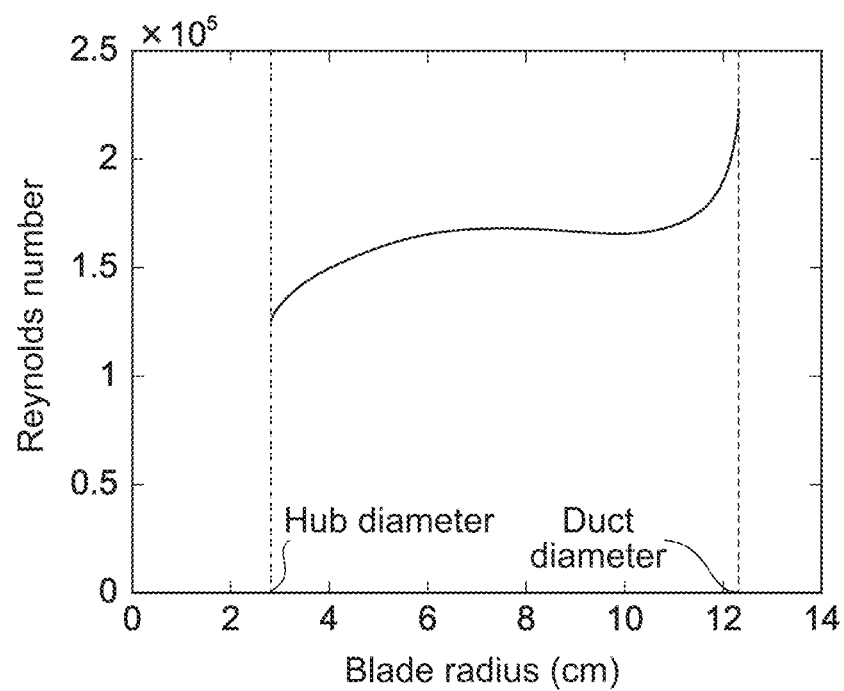
FIG. 7 A graph showing the Reynolds number in the example according to the present invention.

FIG. 7 shows a Reynolds number in this example.

As shown in FIG. 7, the Reynolds number is kept substantially constant over the long radius of the blade 22 and there is no region where the Reynolds number is small. Therefore, the blade 22 is less likely to be affected by an increase in drag due to the small Reynolds number.

Therefore, a high figure of merit can be obtained even with a small ducted fan.

(Prove)

The present invention is capable of maximizing static thrust of the ducted fan as described above. Hereinafter, it will be proven.

Figures 8A, 8B:
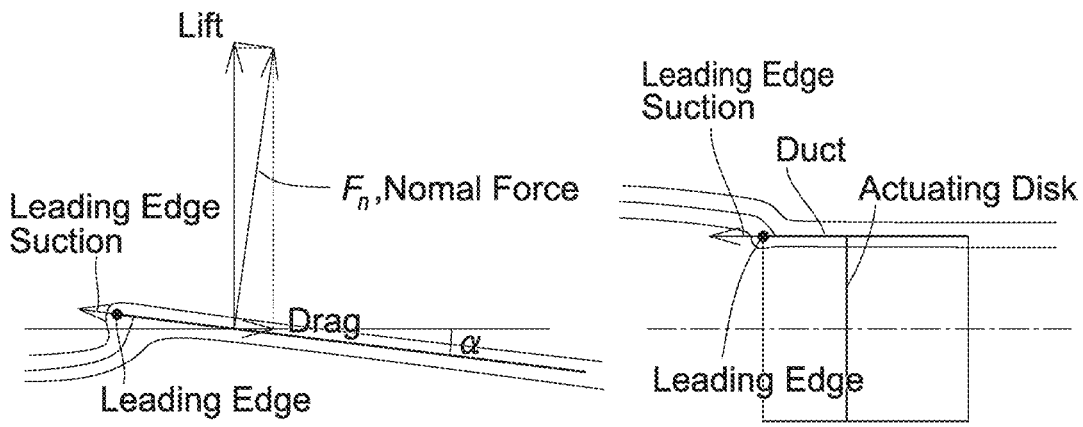
FIGS. 8a-8b Diagrams showing leading edge thrust that acts on a flat plate wing and a duct.

Problem in Design to Maximize Static Thrust 1-1. Problem of Leading Edge Thrust Produced on the Lip With a flat plate wing, as shown in FIG. 8(a), the flow going around the leading edge of the wing generates a high negative pressure on the leading edge. Due to this negative pressure, force in a thrust direction acts on the leading edge. Since the wing is approximated by the flat plate in the Vortex Lattice Method (hereinafter, VLM), the leading edge area is 0 and the velocity of the flow going around it is infinite. Therefore, there is a need for using a special calculation method for calculation of the leading edge thrust (see Weissinger, J.: The Lift Distribution of Swept-Back Wings, NACA TM-1120, 1947). However, this method can be applied only in a case where the potential of a target surface is continuous.

Also as shown in FIG. 8(b), when the disc loading is high (forward velocity V is not sufficiently higher than axial induced velocity v), there is a flow going around the lip and a leading edge thrust acts on the lip. Since trailing vortices are generated in the rear of the fan surface inside the duct, the potential is discontinuous in a flow direction and this leading edge thrust cannot be calculated by the VLM.

For avoiding such leading edge thrust calculation, the inventor of the present invention conducted calculation under the condition where the flow going around the lip can be ignored, that is, under the restriction of V>v in Non-Patent Literature 3.

Here, the leading edge thrust of the static ducted fan that is a target is high, and in accordance with the simple momentum theory, leading edge thrust $T_D$ of total thrust T, which acts on the lip, reaches 50% of the total thrust T (see Non-Patent Literature 1). Therefore, the total thrust T of the ducted fan was disable to be accurately determined by using the VLM.

1-2. Problem of Spiral Vortex Pitch

In the general propeller theory, the induced velocity v is considered as being negligibly low as compared to the forward velocity V, and a pitch of spiral vortices emitted by the blade is determined on the basis of the blade rotation angular velocity Ω and V. However, in the problem to maximize static thrust, the forward velocity V is 0. Therefore, the conventional method of determining a spiral vortex pitch cannot be used.

1-3. Problem of Inconsistency of Momentum on Trefftz Plane

The total thrust T of the ducted fan has to be equal to thrust $T_T$ (hereinafter, Trefftz plane thrust) calculated on the basis of a velocity distribution on a Trefftz plane. Originally, this total thrust T was not equal to the Trefftz plane thrust $T_T$.

1-4. Problem of Accuracy of VLM

Specifically, this problem arises not only in design of the ducted fan to maximize static thrust but also in design of a ducted fan having low disc loading. Since the tip-trailing vortices flow along the duct surface, a circulation of a vortex lattice near the tip-trailing vortices greatly changes. If the lattice is finely defined for grasping such a change in view of this, computation takes an enormous amount of time.

2. Method for Solving Problems

Figure 9:
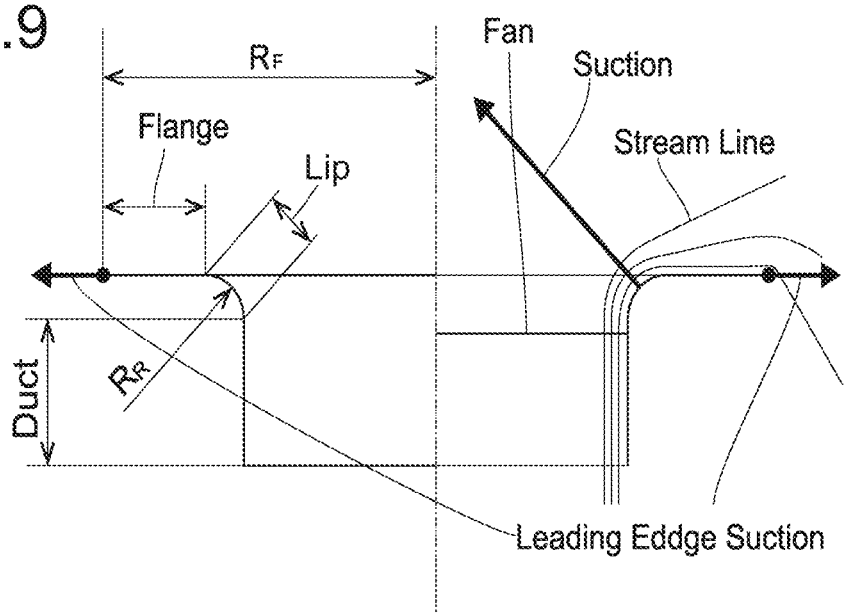
FIG. 9 A diagram showing a duct model with a flange.

The problem of the leading edge thrust at 1-1 can be avoided by providing a duct with a flange as shown in FIG. 9 to provide a connection portion to the duct with curvature. Hereinafter, this portion with the curvature will be referred to as a lip. Although a flow going around the edge of the flange generates leading edge thrust, the flow rate is sufficiently low and the leading edge thrust is negligibly low in a case where the flange has a sufficiently large radius.

Furthermore, leading edge thrust of the same value but in an opposite direction is generated also on the opposite side of the flange, and thus such leading edge thrust on both sides cancel each other. Leading edge thrust at the lip, which is generated with a straight duct without the flange, is obtained by integrating an axial component of a negative pressure formed by a flow going around the lip and the flange of the duct with the flange in FIG. 9 in the surfaces of the lip and the flange. Calculation to be described later proves that this leading edge thrust depends on the radius of curvature $R_R$ of the lip.

The problem at 1-2 was solved in the following manner. First, assuming that the induced velocity determined in accordance with the simple momentum theory is initial vortex displacement velocity $v_0'$, optimization calculation is performed. Next, vortex displacement velocity $v'$ given by the following expression is calculated on the basis of the resultant axial induced velocity w in the blade (that takes a negative value in a coordinate system to be described later) and induced velocity v in a direction of rotation.

[Expression 1]

$$v' = -w + v \tan \phi \tag{1}$$

Here, $\phi$ is given by the following expression.

[Expression 2]

$$\phi = \tan^{-1} \frac{w}{r\Omega - v} \tag{2}$$

The vortex displacement velocity $v'$ is not constant in a radial direction, and thus curve fitting is performed with a simple function and a pitch is determined by using that function. Using these new trailing vortices, optimum design is performed and new trailing vortices are generated. This spiral vortex update is repeated, and it is determined that a solution has converged when it becomes below a truncation error.

Figure 10:
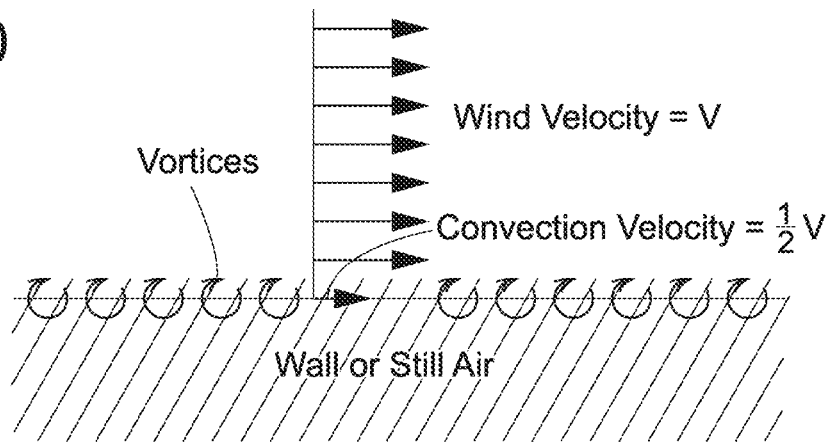
FIG. 10 A diagram showing moving velocity of vortices at a boundary between a wall surface and a uniform airflow.

The problem at 1-3 was solved by considering the fact that the duct surface and duct-emitted vortices to be described later are present at a boundary with a static duct wall surface or the atmosphere. In accordance with the Hyperfunction Theory (Isao IMAI. Applied Hyperfunction Theory I, SAIENSU-SHA Co., Ltd., 1981.), when a flow at the velocity V is present along a static wall surface as in FIG. 10, vortices are distributed on the wall surface and those vortices move at velocity of V/2. Also, the total thrust T becomes equal to the Trefftz plane thrust $T_T$ by setting displacement velocity of the tip-trailing vortex on the duct surface and duct trailing edge horseshoe vortices (to be described later) at a boundary between the still air and the flow inside the duct to be half the vortex displacement velocity $v'$ right inside.

Figure 11:
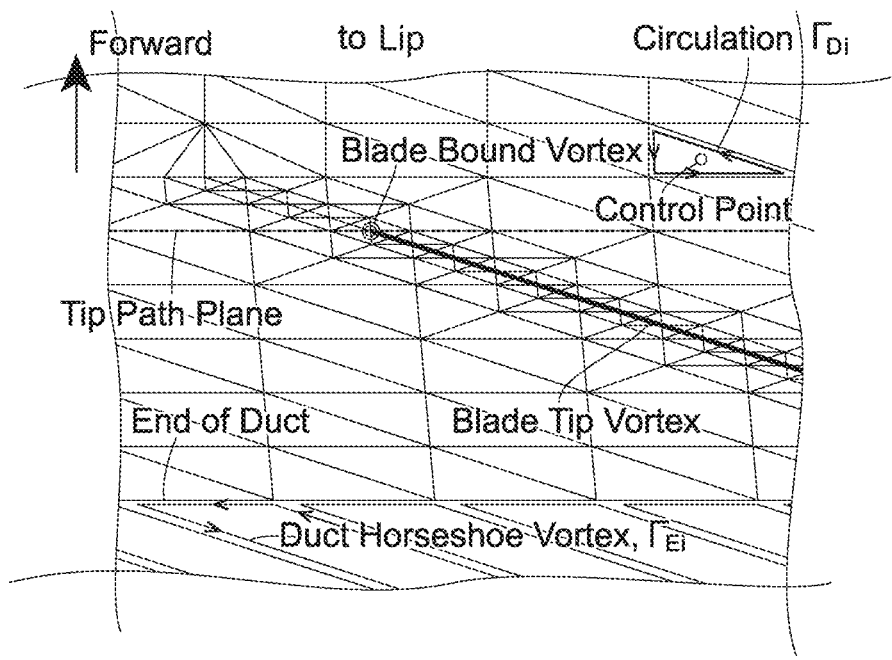
FIG. 11 A diagram showing a layered structure of vortex lattices.

For the problem at 1-4, the duct surface is not divided with a constant size lattice as in FIG. 11, and a lattice having a layered structure as in FIG. 11 is used. The size of the lattice near the tip vortices is set to be $(\frac{1}{2})^n$ times as large as that of a reference lattice. FIG. 11 shows a case where n=2. By using triangles for the lattice and setting oblique sides to correspond to spiral angles of the tip vortices, a fine lattice can be arranged in the periphery of the tip vortices having a great change in circulation distribution.

3. Optimization Method 3-1. Model of Ducted Fan

Figure 12:
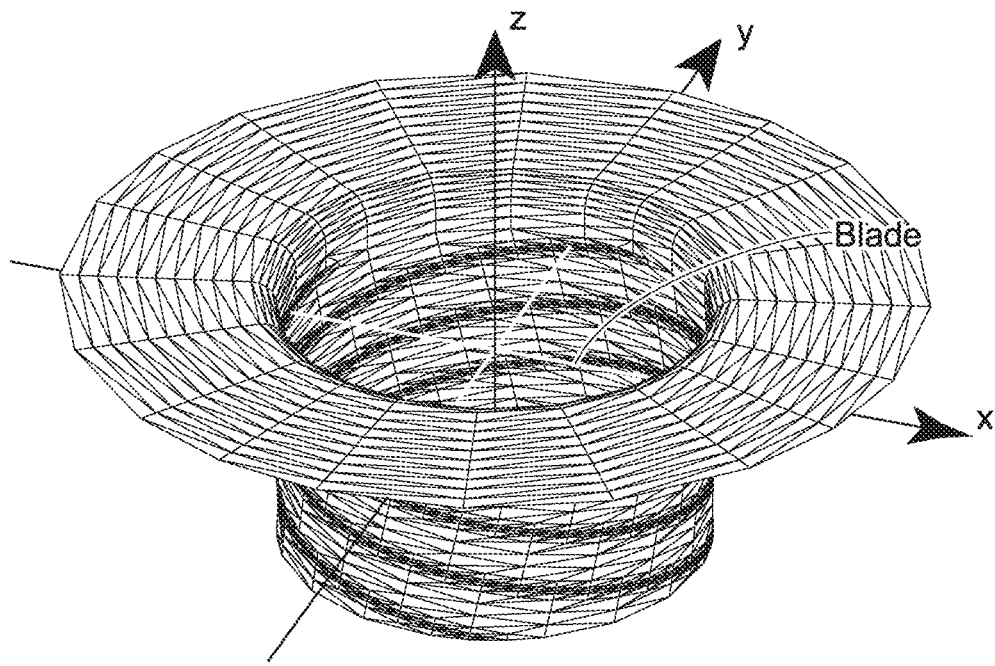
FIG. 12 A diagram showing a coordinate system of the ducted fan.

A coordinate system of the ducted fan is set as in FIG. 12. A lattice of the duct surface (hereinafter, duct lattice) are numbered with arbitrary numbers and a circulation of an i-th duct lattice is denoted by $\Gamma_{Di}$ as shown in FIG. 11. Moreover, a control point is provided at the centroid position of the lattice. Spiral horseshoe vortices (hereinafter, duct horseshoe vortices) are emitted from a rear end of the duct, and a circulation of an i-th duct horseshoe vortex is denoted by $\Gamma_{Ei}$. It is sufficient that an axial length of the duct horseshoe vortices is five times as large as the diameter.

Figure 13:
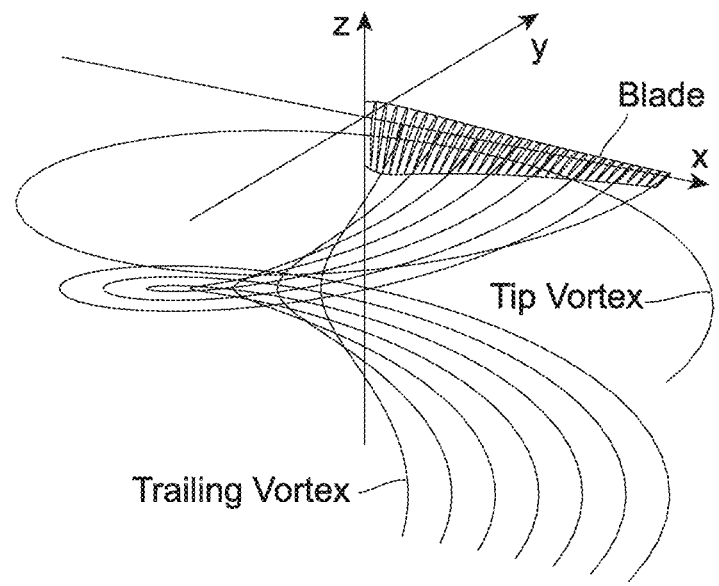
FIG. 13 A diagram showing the blade, trailing vortices, and a tip vortex.
Figure 14:
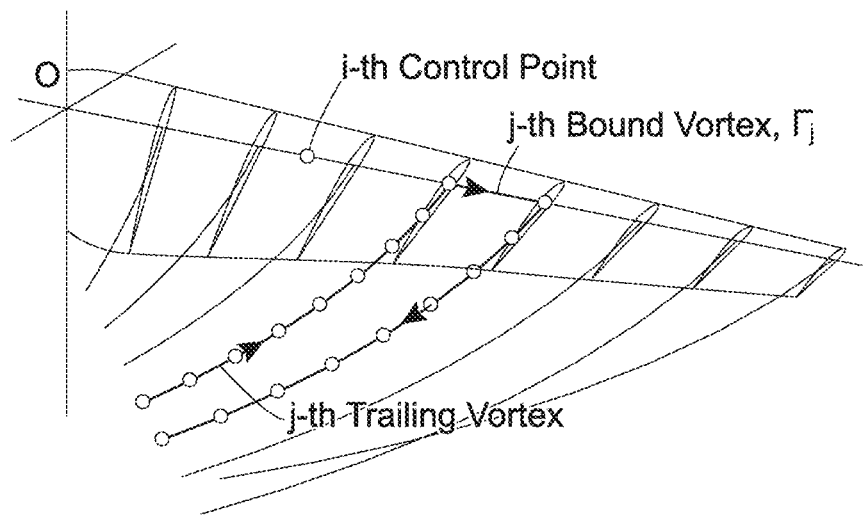
FIG. 14 A diagram showing discretization of the blade and the trailing vortices.

Moreover, a coordinate system of the blade is shown in FIG. 13. Although any number of blades B is used, a first blade is set to correspond to the x-axis. The blade is represented by a lift line, this lift line is equally divided into N-number of lift lines, and a division width is denoted by dr. Vortices are emitted from division points in a spiral shape in accordance with the initial vortex displacement velocity $v_0'$ and the blade angular velocity $\Omega$. It is sufficient that an axial length of the tip-trailing vortices are approximately five times as large as the diameter. The trailing vortices are discretized and approximated by polygonal curves as shown in FIG. 14. The tip vortices are made to correspond to the oblique sides of the finest lattices of the duct.

Control points are set at middle points of lift lines (hereinafter, blade elements) divided as shown in FIG. 14. It is assumed that a spiral horseshoe vortex constituted by a j-th trailing vortex, a j-th bound vortex, and a j+1-th trailing vortex is a j-th horseshoe vortex and a circulation of this horseshoe vortex is denoted by $\Gamma_{Bj}$.

3-2. Thrust and Suction Power of Fan

Figure 15:
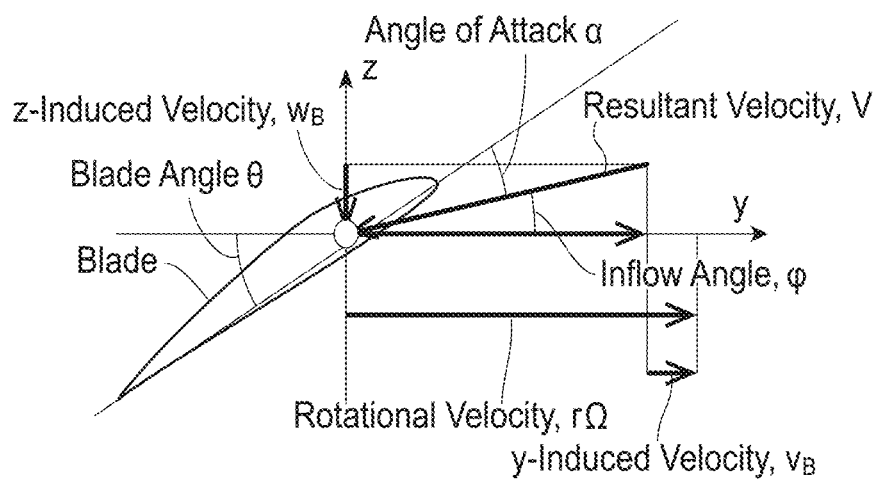
FIG. 15 A diagram showing a flow that comes in the blade.

A velocity vector diagram of a flow that comes in a control point of the blade is shown in FIG. 15. A y direction component and a z direction component of induced velocity at an i-th control point of the blade are denoted by $v_{Bi}$ and $w_{Bi}$, respectively.

In general, $w_{Bi}$ takes a negative value. Relative velocity $U_{Ti}$ in a horizontal direction is given by

[Expression 3]

$$U_{Ti} = r_i \Omega - v_{Bi} \tag{3}$$

Also, a velocity component $U_{Pi}$ in a vertical direction (upward is positive) is given by the following expression.

[Expression 4]

$$U_{Pi} = w_{Bi} \tag{4}$$

An inflow angle $\phi_i$ is given by the following expression.

[Expression 5]

$$\phi_i = \tan^{-1}\frac{U_{Pi}}{U_{Ti}} \quad (5)$$

In general, $\phi_i$ defined in Expression (5) takes a negative value. Assuming that a blade mounting angle in an i-th blade element is denoted by $\theta_i$, an effective angle of attack $\alpha_i$ is given by the following expression.

[Expression 6]

$$\alpha = \theta_i + \phi_i \quad (6)$$

Moreover, velocity $V_i$ of the flow that comes in it is given by the following expression.

[Expression 7]

$$V_i = \sqrt{U_{Pi}^2 + U_{Ti}^2} \quad (7)$$

Since a circulation of the i-th blade element is $\Gamma_{Bi}$, local lift $dL_i$ is given by the following expression in accordance with the Kutta-Joukowski theorem.

[Expression 8]

$$dL_i = \rho V_i \Gamma_{Bi} \Delta_R \quad (8)$$

Here, $\Delta_R$ denotes the division width of the blade element. Assuming that the design lift coefficient is denoted by $C_L$ and a chord length that is an unknown value is denoted by $c_i$, the local lift $dL_i$ is also expressed by the following expression.

[Expression 9]

$$dL_i = \tfrac{1}{2}\rho V_i^2 C_L c_i \Delta_R \quad (9)$$

By solving the equations that are Expressions (8) and (9), the following expression is obtained.

[Expression 10]

$$c_i = \frac{2\Gamma_{Bi}}{V_i C_L} \quad (10)$$

Therefore, a Reynolds number Re is determined on the basis of the chord length $c_i$ and the flow rate $V_i$ and $C_D$ is determined on the basis of the selected airfoil, the Reynolds number Re, and the design lift coefficient $C_L$. Using this $C_D$, local drag $dD_i$ is given by the following expression.

[Expression 11]

$$dD_i = \tfrac{1}{2}\rho V_i^2 C_D c_i \Delta R \quad (11)$$

Figure 16:
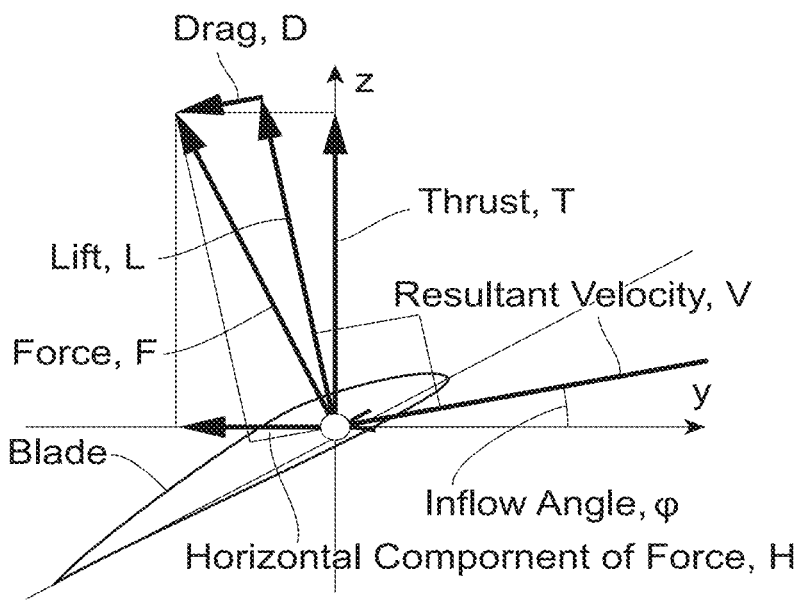
FIG. 16 A diagram showing force that acts on the blade.

Those $dL_i$ and $dD_i$ are shown in FIG. 16. According to FIG. 16, local thrust $dT_i$ and a local horizontal component of force $dH_i$ are given by the following expressions, respectively.

[Expression 12]

$$dT_i = dL_i \cos\phi_i - dD_i \sin\phi_i \quad (12)$$

[Expression 13]

$$dH_i = dD_i \cos\phi_i + dL_i \sin\phi_i \quad (13)$$

Local power $dP_i$ is expressed by the following expression in accordance with Expression (13).

[Expression 14]

$$dP_i = dH_i r_i \Omega \quad (14)$$

In a case where the drag is not considered, the local thrust $dT_i$ is immediately given by the following expression in accordance with the Kutta-Joukowski theorem.

[Expression 15]

$$dT_i = \rho U_{Ti} \Gamma_{Bi} \Delta_R \quad (15)$$

Also, the local horizontal component of force $dH_i$ is given by the following expression.

[Expression 16]

$$dT_i = -\rho U_{Pi} \Gamma_{Bi} \Delta_R \quad (16)$$

The reason why the negative sign is added is because $U_{Pi}$ is typically negative. Thrust $T_F$ and required power P generated by the fan are given by the following expressions, respectively.

[Expression 17]

$$T_F = B\sum_{i=1}^{N_B} dT_i \quad (17)$$

[Expression 18]

$$P = B\sum_{i=1}^{N_B} dH_i r_i \Omega \quad (18)$$

Where B denotes the number of blades.

3-3. Calculation Method for Duct Thrust

In a case where a fan diameter is equal to a duct exit diameter, it is derived in accordance with the simple momentum theory that the percentage of thrust $T_F$ generated by the fan, which occupies the total thrust, is 50% and the percentage of thrust $T_D$ generated by the lip of the duct (hereinafter, duct thrust), which occupies the total thrust T, is 50%.

Duct thrust $T_D$ is obtained by multiplying negative pressures that act on all duct lattices by the lattice areas and summing the z direction components. Since lattices whose normal line is horizontal actually do not produce force of the z direction component, it is sufficient that the calculation is performed only on duct lattices that constitute the flange and the lip of the duct. Since the control point of the i-th duct lattice of the flange and the lip is between the inside in which the flow is present and the outside that is the dead water region, the velocity $(u, v, w)^T$ on the inner surface of the duct is twice as high as $(u_{Dci}, v_{Dci}, w_{Dci})^T$ in accordance with the discussion with FIG. 10. Moreover, duct thrust $dT'_{Di}$ at the control point of the i-th duct lattice is expressed by the following expression in accordance with Bernoulli's principle for unsteady flow.

[Expression 19]

$$dT'_{Di} = d\tilde{T}_{Di} + dT_{Di} \quad (19)$$

Where the first item on the right side is a time derivative item of the potential and the second item is given by the following expression.

[Expression 20]

$$dT_{Di} = \tfrac{1}{2}\rho(u_{Di}^2 + v_{Di}^2 + w_{Di}^2)S_i n_{zi} \quad (20)$$

Where $n_{zi}$ denotes a z component of a normal line vector of an i-th lattice. When summing local thrust $dT'_{Di}$ over the duct, the time derivative item of the potential becomes 0 due to blade periodicity. Therefore, the duct thrust $T_D$ is given by the following expression.

[Expression 21]

$$T_D = \sum_{i=1}^{N_D} dT_{Di} \qquad (21)$$

3-4. Calculation or Induced Velocity on Blade

The induced velocity was used for calculation of the thrust $T_F$ generated by the fan and the required power P of the fan. In this section, a calculation expression for such induced velocity will be derived.

Three types of vortices causes the induced velocity. There are $N_B \times B$ number of blade horseshoe vortices (circulation $\Gamma_{Bi}$), $N_D$ number of duct surface vortex circles (circulation $\Gamma_{Di}$), and $N_E$ number of duct horseshoe vortices (circulation $\Gamma_{Ei}$).

First, in accordance with the Biot-Savart law, the induced velocity $(u_{BBi}, v_{BBi}, w_{BBi})^T$ produced by all the horseshoe vortices of the blade at an i-th blade control point can be expressed by using the following expression and an influence coefficient (see Non-Patent Literature 3).

[Expression 22]

$$u_{BBi} = X_{BBij}\Gamma_{Bj}$$

$$v_{BBi} = Y_{BBij}\Gamma_{Bj}$$

$$w_{BBi} = Z_{BBij}\Gamma_{Bj} \qquad (22)$$

Where the indices i and j follow the Einstein notation. The notation of (22) has the same definition as the notation of the following expression.

[Expression 23]

$$u_{BB} = X_{BB}\Gamma_B$$

$$v_{BB} = Y_{BB}\Gamma_B$$

$$w_{BB} = Z_{BB}\Gamma_B \qquad (23)$$

The induced velocity from the duct lattice and the induced velocity from the duct horseshoe vortex can be written as the following expressions, respectively.

[Expression 24]

$$u_{BD} = X_{BD}\Gamma_D$$

$$v_{BD} = Y_{BD}\Gamma_D$$

$$w_{BD} = Z_{BD}\Gamma_D| \qquad (24)$$

[Expression 25]

$$u_{BE} = X_{BE}\Gamma_E$$

$$v_{BE} = Y_{BE}\Gamma_E$$

$$w_{BE} = Z_{BE}\Gamma_E \qquad (25)$$

The above is the induced velocity produced on the blade.

3-5. Boundary Condition on Duct Surface

A normal component $u_{DB}$ of the induced velocity at the control point of the duct lattice with respect to the lattice, which is produced by the blade horseshoe vortex, is expressed by the following expression.

[Expression 26]

$$u_{DB} = K_{DB}\Gamma_B \qquad (26)$$

A normal component $u_{DD}$ of the induced velocity at the control point of the duct lattice with respect to the lattice, which is produced by the duct lattice, and a normal component $u_{DE}$ of the induced velocity at the control point of the duct lattice with respect to the lattice, which is produced by the duct horseshoe vortex, are expressed by the following expressions, respectively.

[Expression 27]

$$u_{DD} = K_{DD}\Gamma_D \qquad (27)$$

[Expression 28]

$$u_{DE} = K_{DE}\Gamma_E \qquad (28)$$

Since the duct is solid, no flows penetrate the surface. Therefore, the normal component of the induced velocity at the control point of the duct lattice with respect to the lattice has to be 0. Therefore, the following expression is obtained.

[Expression 29]

$$u_{DB} + u_{DD} + u_{DE} = 0 \qquad (29)$$

Such conditions as many as the number of duct lattices, i.e., $N_D$ number of conditions exist.

3-6. Boundary Condition of Duct Trailing Edge

Figure 17:
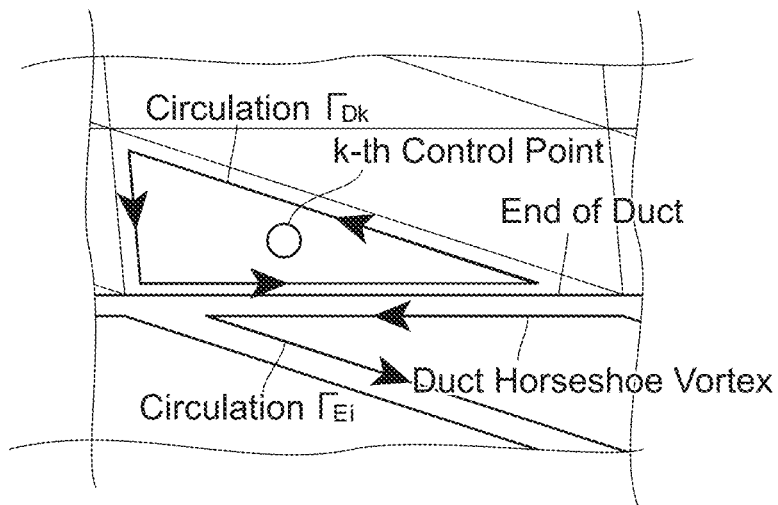
FIG. 17 A diagram showing a detailed diagram of a duct trailing edge.

An enlarged diagram of the vicinity of the duct trailing edge of FIG. 11 is shown in FIG. 17. The i-th duct horseshoe vortex is adjacent to a k-th duct lattice. The number of duct lattices are $N_D$. Only $N_E$ number of duct lattices out of the $N_D$ number of duct lattices are positioned at the trailing edge. $N_E$ is significantly smaller than $N_D$. With a matrix $K_K$ of elements of suitable vertical $N_E$ columns by horizontal $N_D$ rows, which are 1 or 0, $K_{Kij}\Gamma_{Dj}$ can be elements of $\Gamma_D$ adjacent to an i-th duct trailing edge horseshoe vortex.

According to the Kutta condition, a circulation of the trailing edge has to be 0. While paying attention to the direction of circulation of FIG. 17, it is expressed by the following expression.

[Expression 30]

$$\Gamma_E = K_K \Gamma_D \qquad (30)$$

3-7. Reduction of Variables $N_D$ number of conditions expressed by Expression (29), which corresponds to the number of elements of $\Gamma_D$, exist. In general, $N_D$ becomes several tens of thousands. On the other hand, the number of elements $N_B$ of $\Gamma_B$ are less, several tens to several hundreds. In this section, the amount of variable is greatly reduced by erasing $\Gamma_D$.

By substituting Expressions (26), (27), and (28) for Expression (29), the following expression is obtained.

[Expression 31]

$$K_{DB}\Gamma_B + K_{DD}\Gamma_D + K_{DE}\Gamma_E = 0 \qquad (31)$$

According to Expression (30), Expression (31) becomes as follows.

[Expression 32]

$$K_{DB}\Gamma_B + K_{DD}\Gamma_D + K_{DE}K_K\Gamma_D = 0 \qquad (32)$$

By further modifying this expression, the following expression is obtained.

[Expression 33]
$$(K_{DD}+K_{DE}K_K)\Gamma_D=-K_{DB}\Gamma_B \quad (33)$$

Here, it is assumed that the following expression is established.

[Expression 34]
$$K=-(K_{DD}+K_{DE}K_K)^{-1}K_{DB} \quad (34)$$

Then, the following expression is obtained.

[Expression 35]
$$\Gamma_D=K\Gamma_B \quad (35)$$

Moreover, by substituting Expression (35) for Expression (30), the following expression is obtained.

[Expression 36]
$$\Gamma_E=K_K K\Gamma_B \quad (36)$$

An x component $u_B$ of the induced velocity at the blade is expressed by the following expression in accordance with Expressions (22), (24), and (25).

[Expression 37]
$$u_B=X_{BB}\Gamma_B+X_{BD}\Gamma_D+X_{BE}\Gamma_E \quad (37)$$

By substituting Expression (35) and Expression (36) for this expression, the following expression is obtained.

[Expression 38]
$$u_B=X_{BB}\Gamma_B+X_{BD}K\Gamma_B+X_{BE}K_K K\Gamma_B \quad (38)$$

By summarizing it with respect to $\Gamma_B$, the following expression is obtained.

[Expression 39]
$$u_B=(X_{BB}+X_{BD}K+X_{BE}K_K K)\Gamma_B \quad (39)$$

Here, the following expression is defined.

[Expression 40]
$$X_B=X_{BB}+X_{BD}K+K_{BE}K_K K \quad (40)$$

Then, Expression (39) becomes as follows.

[Expression 41]
$$u_B=X_B\Gamma_B \quad (41)$$

By conducting a similar operation also on $v_B$ and $w_B$ and defining $Y_B$ and $Z_B$, those are written as the following expressions.

[Expression 42]
$$v_B=Y_B\Gamma_B \quad (42)$$

[Expression 43]
$$w_B=Z_B\Gamma_B \quad (43)$$

3-8. Representation of Duct Thrust in Quadratic Form

In this section, the duct thrust $T_D$ determined at 3-3 will be represented in a quadratic form of $\Gamma_B$.

The induced velocity at the duct inner surface can be expressed by the following expressions in view of the fact that the induced velocity at the duct inner surface is twice as high as the induced velocity at the duct lattice and in accordance with a procedure similar to the procedure for deriving Expressions (41), (42), and (43).

[Expression 44]
$$u_D=X_D\Gamma_B \quad (44)$$

[Expression 45]
$$v_D=Y_D\Gamma_B \quad (45)$$

[Expression 46]
$$w_D=Z_D\Gamma_B \quad (46)$$

It is assumed that the area of the i-th duct lattice is denoted by $S_i$ and a z component of a normal vector is denoted by $n_{Zi}$. The following diagonal matrix is used.

[Expression 47]
$$K_Q=\text{diag}(\tfrac{1}{2}\rho S_i n_{Zi}) \quad (47)$$

Then, the duct thrust $T_D$ is given by the following expression.

[Expression 48]
$$T_D=u_D^T K_Q u_D+v_D^T K_Q v_D+w_D^T K_Q w_D \quad (48)$$

Here, a definition is made as follows.

[Expression 49]
$$T_D=X_D^T K_Q X_D+Y_D^T K_Q Y_D+Z_D^T K_Q Z_D \quad (49)$$

Then, Expression (48) can be written as follows.

[Expression 50]
$$T_D=\Gamma_D^T T_D \Gamma_D \quad (50)$$

3-9. Thrust and Power in Case where Drag is not Considered

By substituting Expression (15) for Expression (17) and further substituting Expression (3) and Expression (42) for it, fan thrust $T_F$ in the case where the drag is not considered is expressed by the following expression.

[Expression 51]
$$T_F=B\rho(r_i\Omega-Y_{Bij}\Gamma_{Bj})\Gamma_{Bi}\Delta_R \quad (51)$$

Alternatively, it is expressed by the following expression by using a vector.

[Expression 52]
$$T_F=\Gamma_B^T A'\Gamma_B+b^T\Gamma_B \quad (52)$$

Where A' denotes a matrix of $N_B$ by $N_B$ given by the following expression.

[Expression 53]
$$A'=-\rho B\Delta_R(Y_{Bij}) \quad (53)$$

Furthermore, b denotes a column vector of the number of elements $N_B$ given by the following expression.

[Expression 54]
$$b=\rho B\Omega\Delta_R(r_i) \quad (54)$$

By substituting Expression (16) for Expression (18) and further substituting Expression (4) and Expression (43) for it, required power P of the fan is expressed by the following expression.

[Expression 55]
$$P=-B\rho Z_{Bij}\Gamma_{Bi}\Gamma_{Bj}\Delta_R r_i\Omega \quad (55)$$

Alternatively, it is expressed by the following expression by using a vector.

[Expression 56]

$$P = \Gamma_B^T C \Gamma_B \quad (56)$$

Where C denotes a matrix of $N_B$ by $N_B$ given by the following expression.

[Expression 57]

$$C = -\rho B r_i \Omega \Delta_R(Z_{Bij}) \quad (57)$$

Since the thrust T of the entire ducted fan is the sum of the fan thrust $T_F$ and the duct thrust $T_D$, the thrust T is expressed by the following expression.

[Expression 58]

$$T = \Gamma_B^T A_D \Gamma_B + b^T \Gamma_B \quad (58)$$

Where A is a matrix of $N_B$ by $N_B$ given by the following expression.

[Expression 59]

$$A = A' + T_D \quad (59)$$

3-10. Optimization Problem

The problem to determine a shape of the ducted fan that maximizes static thrust results in a problem to determine $\Gamma_B$ satisfying the following optimization problem as a result of the above-mentioned calculation.

minimize $-T$ subject to $P - P_0 = 0$

Where $P_0$ is required power set by a designer.
Once $\Gamma_B$ is obtained, the blade angle $\theta_i$ can be determined in accordance with Expression (6) and the chord length $c_i$ can be determined in accordance with Expression (10).

In the case where the drag is not considered, T that is an objective function is given by Expression (58) and P that is a constraint condition is given by Expression (56). However, when this problem is optimized, the duct thrust $T_D$ converges into a significantly large value. In view of this, a condition that the duct thrust $T_D$ derived from the simple momentum theory is equal to the half of the total thrust T is added as a constraint condition that constrains the value of $T_D$. The improved problem takes the following form.

minimize $-T$ subject to $P - P_0 = 0, T_D = 0.5T$

In a case where the drag is considered, the thrust T cannot be written in a quadratic form as in Expression (58). Induced velocity $v_B$ and $w_B$ is determined on the basis of Expressions (42) and (43), the fan thrust $T_F$ is determined on the basis of Expressions (3) to (12) and Expression (17), and the thrust T is obtained as the following expression on the basis of the duct thrust $T_D$ determined on the basis of Expression (50).

[Expression 60]

$$T = T_F + T_D \quad (60)$$

Also regarding the required power P, the induced velocity $v_B$ and $w_B$ are determined on the basis of Expressions (42) and (43), and the required power P is determined on the basis of Expressions of (3) to (14) and Expression (18). Since the value of the drag coefficient is significantly smaller than the lift coefficient, the solution considering the drag does not greatly differ from that in the case where the drag is not considered.

3-11. Repeated Calculation of Optimization Problem

As described in the previous section when solving this problem, repeated calculation has to be performed until the vortex displacement velocity of the spiral vortices converges. Here, the vortex displacement velocity is expressed as a quadratic function in order to makes repeated calculation stable. The coefficient of this quadratic function is updated by curve fitting every repeated calculation.

Although $T_D = 0.5$ T required by the simple momentum theory is used as the constraint condition at 3-10, the duct thrust $T_D$ does not necessarily become 50% of the total thrust T even with a more realistic mathematical model. A parameter k (hereinafter, lip factor) is introduced to establish $T_D = kT$, and the Trefftz plane thrust $T_T$ and the total thrust T are made equal with a degree of freedom obtained by introduction of this parameter. Specifically, k is reduced in a case where Trefftz plane thrust $T_T$ is higher than the total thrust T, and k is increased and made to converge in a case where Trefftz plane thrust $T_T$ is lower than the total thrust T.

3-12. Extension to Model Considering Hub

Figure 18:
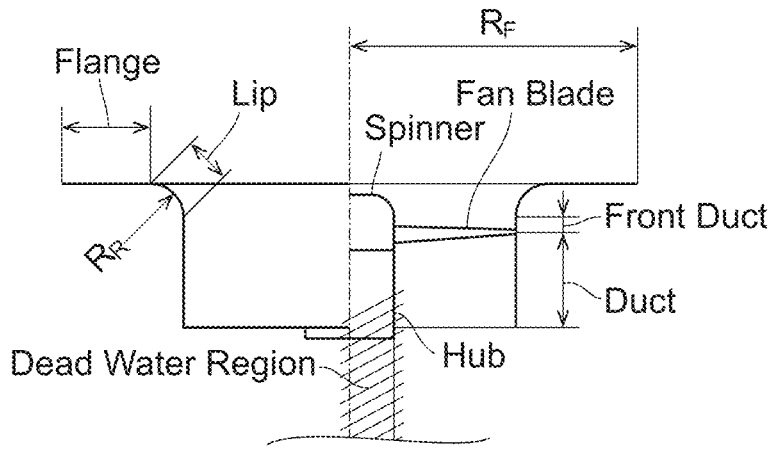
FIG. 18 A diagram showing a ducted fan with a hub.

As shown in FIG. 18, it is necessary to provide a hub that stores a motor or the like at the center of the duct in reality. The hub is fixed to the center of the duct and stores the motor. Blades and a spinner are mounted on the motor shaft. Here, it is modeled as follows. It is assumed that the spinner and the hub have the same diameter, the hub is a short circular column, and a flow is separated at a hub rear end and goes straight. Therefore, there is a dead water region in the downstream of the hub rear end. Like the duct that serves as an end plate of a blade tip, the spinner and the hub serve as an end plate of a blade root. Therefore, spiral root vortices are present on the spinner and a hub surface. As in the duct surface, lattices having a layered structure is set on a spinner surface and the hub surface, and hub horseshoe vortices are emitted from the hub rear end similar to duct horseshoe vortices. Moreover, the duct length refers to a length of the duct, which extends rearward from the blade rotation surface. The front duct refers to a portion of the straight portion of the duct, which extends forward from the blade surface.

Terminology will be redefined below. The duct lattice is constituted by lattices of the flange, the lip, the front duct, the duct, the spinner, and the hub surface. The duct horseshoe vortex is constituted by the horseshoe vortices emitted from the duct trailing edge and the horseshoe vortices emitted from the hub trailing edge. The duct thrust refers to thrust generated by the lip, the flange, and the spinner. By redefining the duct lattice, the duct horseshoe vortex, and the duct thrust in this manner, a model including the spinner and the hub can be handled.

4. Calculation Result

The optimization problem considering the drag was solved. For solving, the constraint condition was incorporated in the objective function in accordance with a penalty function method and this objective function was minimized by simulated annealing. Even with various initial values, convergence into the same solution was achieved. The calculation condition was as follows.

<Calculation Condition>
Duct diameter: 0.25 m
Spinner diameter: 0.06 m
Required power $P_0$: 1200 W
Number of blades B: 4
Duct length: 0.12 m
Front duct length: 0.015 m Number of blade divisions $N_B$: 80
Number of layers of lattice n: 2
Number of duct lattices $N_D$: about 15,000 (with no hub)
   : about 30,000 (with a hub)
Design lift coefficient $C_L$: 0.6
Shape drag coefficient $C_D$: 0.014 (independent of Re)
<Parameters>
Lip radius $R_R$: 0.01 to 0.06 m
Flange radius $R_F$: 0.25, 0.75 m Since the Trefftz plane is located sufficiently behind the duct, it is not affected by the duct but affected only by blade-emitted vortices and duct horseshoe vortices. In view of this, when calculating the Trefftz plane thrust $T_T$, the blade-emitted vortices and the duct horseshoe vortices whose total length was 10 times as large as the duct diameter was generated and the Trefftz plane was set at the center.

Figure 19A:
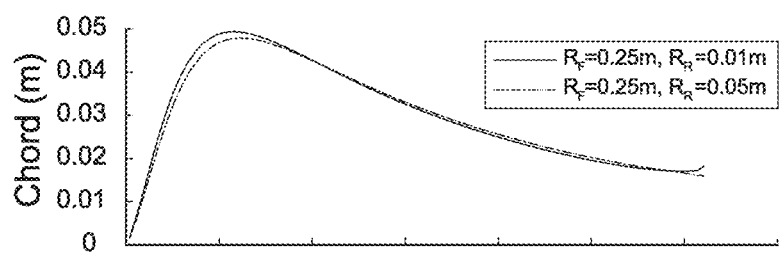
FIGS. 19a-19b Graphs showing blade shape comparison.
Figure 19B:
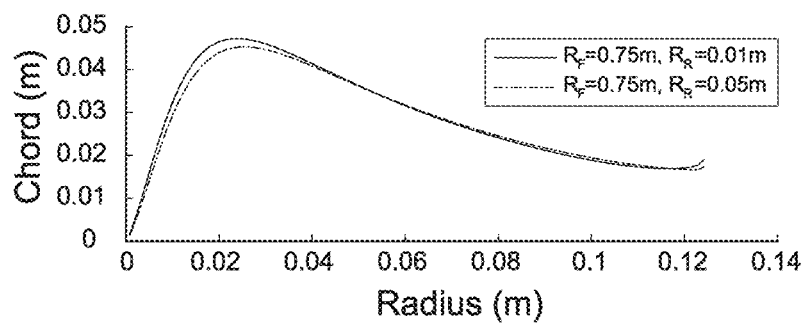
Figure 20A:
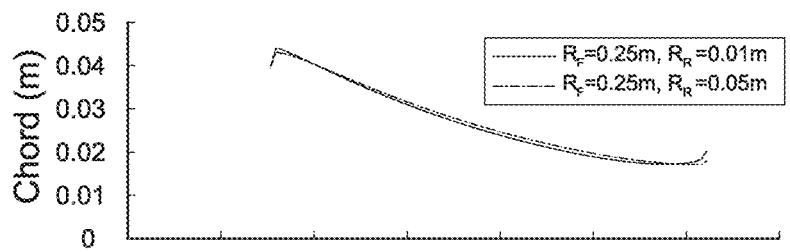
FIGS. 20a-20b Graphs showing blade shape comparison (with a hub).
Figure 20B:
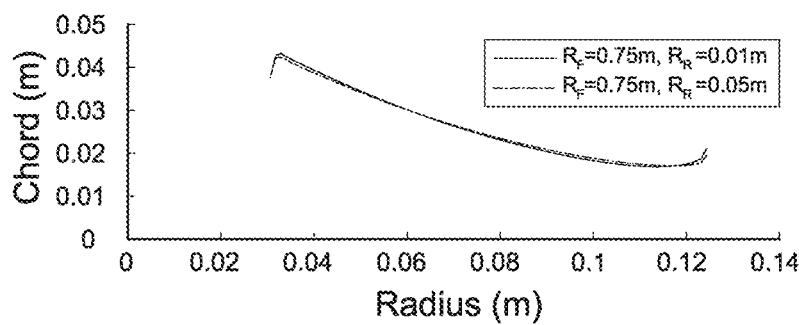
Figure 21:
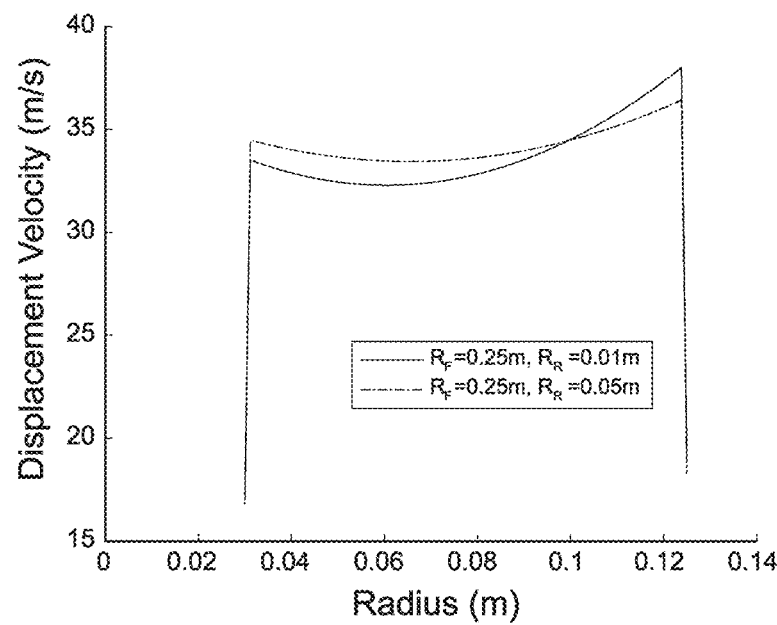
FIG. 21 A graph showing comparison of vortex displacement velocity (with a hub).

A blade shape when the flange radius $R_F$ obtained in optimization is 0.25 m is shown on an upper side of FIGS. 19a-19b and a blade shape when the flange radius $R_F$ obtained in optimization is 0.75 m is shown on a lower side of FIGS. 19a-19b. A case where the lip radius $R_R$ is 0.01 m is shown as the solid line and a case where the lip radius $R_R$ is 0.05 m is shown as the long dashed short dashed line. Also, a shape in a case where the flange radius $R_F$ obtained in optimization with the hub is 0.25 m is shown on an upper side of FIGS. 20a-20b and a shape in a case where the flange radius $R_F$ obtained in optimization with the hub is 0.75 m is shown on a lower side of FIGS. 20a-20b. Also here, a case where the lip radius $R_R$ is 0.01 m is shown as the solid line and a case where the lip radius $R_R$ is 0.05 m is shown as the long dashed short dashed line. Vortex displacement velocity under this condition on the upper side of FIGS. 20a-20b is shown in FIG. 21. The vortex displacement velocity shown in the figure is a value obtained by approximation with the quadratic function by curve fitting, and is a flow rate used for determining the shape of the vortex plane in optimization.

Figure 22:
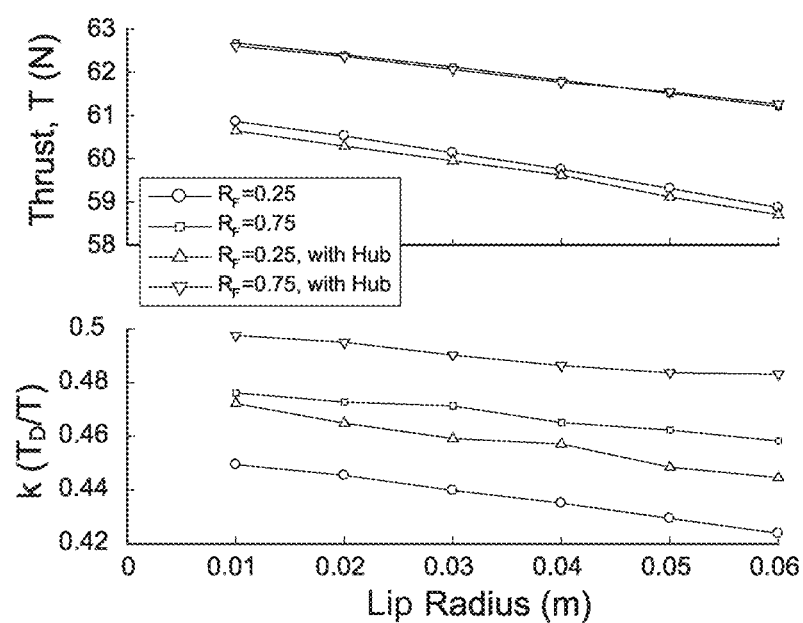
FIG. 22 A graph showing thrust and a lip factor.

The thrust with respect to the lip radius and the lip factor k are shown in FIG. 22. Values in a case where the flange radius $R_F$ is 0.25 m with no hub are shown as ○ and values in a case where the flange radius $R_F$ is 0.75 m with no hub are shown as □. Moreover, values in a case where the flange radius $R_F$ is 0.25 m with a hub are shown as Δ and values in a case where the flange radius $R_F$ is 0.75 m with a hub are shown as ∇.

5. Consideration

The blade shapes each having the enlarged tip as shown in FIGS. 19a to 20b were obtained. It is considered that it is because the duct wall surface prohibits generation of tip vortices and further the lip thrust is utilized. Moreover, the result that the optimized blade shape depends on the lip radius was obtained. It is because the matrix $T_D$ of Expression (50) that provides the duct thrust $T_D$ depends on the duct shape, and it has been expected that the obtained result would depend on the lip radius $R_R$.

As the lip radius $R_R$ becomes smaller, the degree of enlargement of the tip becomes larger. It is considered that it is because as the lip radius becomes smaller, the duct thrust produced by the flow rate of a flow that going around the lip can be increased by increasing axial velocity near the wall surface. As supporting the consideration, the distribution of the vortex displacement velocity v' shown in FIG. 21 is almost uniform where $R_R$=0.05 and the velocity near the wall surface increases where $R_R$=0.01. Moreover, as the lip radius $R_R$ became smaller as shown in FIGS. 19a-19b, the thrust T became higher. It is because as the lip radius $R_R$ becomes smaller, the duct thrust becomes higher as described above. By referring to a graph (FIG. 22) of the lip factor k, it is clear that the duct thrust becomes higher as the lip radius $R_R$ becomes smaller.

In the simple momentum theory, the lip factor k is strictly 0.5, though a value smaller than 0.5 was obtained in this calculation. However, as it can be seen from FIG. 22, the value of k is closer to 0.5 in a case where the flange radius $R_F$ is 0.75 m as compared to a case where the flange radius $R_F$ is 0.25 m, and it is considered that the use of bigger flange makes the lip factor k closer to 0.5.

In a case where the hub is considered, the blade shape becomes a shape when a hub portion of the blade shape with no hub is simply removed. However, referring to the thrust graph in FIG. 22, the thrust does not substantially lower. On the contrary, it is more likely that the lip factor increases and the duct thrust is utilized. As supporting it, a condition that the degree of enlargement of the tip is largest as shown in FIG. 22 was that the hub was provided, the flange radius $R_F$ was 0.75 m, and the lip radius $R_R$ was 0.01 m.

Since the duct thrust becomes higher as the flange radius becomes larger, the thrust becomes higher as the flange radius becomes larger with the same fan diameter. However, although calculation has been performed in a case where the flange radius $R_F$ is twice as large as the fan radius and in a case where the flange radius $R_F$ is six times as large as the fan radius, the increase in thrust is about 2 N and it is only about 3% of the total thrust of 60 N. Application examples in which a bulky and heavier flange is used will be limited to special cases.

Although in this method, optimization has been performed in the case where the drag is considered, the optimum shape does not substantially differ in the Reynolds number region used in the calculation example in the case where the drag is considered and in the case where the drag is not considered. However, there is a possibility that a significantly different solution may be obtained in a case where the Reynolds number is significantly small and the drag coefficient is so large that it cannot be ignored.

6. Conclusion

The design of the ducted fan that maximizes static thrust has been represented as the optimization problem and minimized.

The greatest feature in this calculation is that since the thrust itself considering the drag effect whose solution is uniquely determined irrespective of designer's ability is used as the objective function, optimization can be performed also with a small Reynolds number. Other features in this calculation are that the duct thrust is considered, the hub required when manufacturing the blade is considered, the shape of the emitted vortices are determined by repeated calculation, the pitch of tip vortices is set to be half that of inside vortices, the lattice having a layered structure is used, and optimization can be performed for short time because the number of variables is less, several tens.

The result that the blade obtained by minimizing the optimization problem has a characteristic shape in which the tip is enlarged and the degree of enlargement depends on the duct lip radius was obtained.

(Others)

The ducted fan according to the present invention can be used for a multicopter, a vertical take-off and landing aircraft (VTOL aircraft), a CPU-cooling fan, a radiator-cooling fan, and the like. The ducted fan according to the present invention can also be used as a tail fan of a helicopter.

The present invention is not limited to the above-mentioned embodiment, various modifications can be made for implementation, and the scope of implementation also falls within the technological scope of the present invention.

REFERENCE SIGNS LIST 1 ducted fan
10 duct
12 intake port
14 lip
15 inner wall
20 fan
21 hub
21A tip
22 blade
22A tip
22B tip vicinity portion

The invention claimed is:

1. A ducted fan, comprising:
a duct including a round-shaped lip; and
a propeller including a blade comprising a root and a tip opposite from the root, wherein the tip is adjacent to an inner wall of the duct, wherein a chord length of the blade gradually decreases from the root toward the tip until a tip vicinity portion and then increases from the tip vicinity portion to the tip such that: an axial velocity of flow in the duct increases from the root of the blade as it gets closer to the tip of the blade; and the axial velocity of flow is largest at the tip of the blade,
wherein a position of the tip vicinity portion at which the chord length increases is within a distance equivalent to 15% of a radius of the blade from the tip.

2. The ducted fan according to claim 1, wherein assuming that the chord length of the tip of the blade is denoted by $CL_A$ and the chord length of the tip vicinity portion of the blade is denoted by $CLB_B$, the following expression is established $$1.0 \times CL_B < CL_A \leq 1.3 \times CL_B.$$

3. The ducted fan according to claim 1, wherein a rate of gradual decrease of the chord length of the blade lowers toward the tip.

4. The ducted fan according to claim 1, wherein a ratio of a maximum chord length to a minimum chord length of the blade is 1.5 or more and 3.0 or less.

5. The ducted fan according to claim 1, wherein assuming that an inner diameter of the duct is denoted by R, the lip has a round shape having a radius of curvature r as follows $$3/100 \times R \leq r \leq 30/100 \times R.$$

6. The ducted fan according to claim 1, wherein the duct has a length longer than a length equivalent to 25% of the inner diameter of the duct.

7. The ducted fan according to claim 1, wherein the fan includes a hub that retains the blade, and the hub has a diameter equivalent to 10% or more and 50% or less of the inner diameter of the duct.

8. The ducted fan according to claim 7, wherein the hub retains two to eight blades each being the blade.

* * * * *